United States Patent [19]
Ago et al.

[11] Patent Number: 5,684,437
[45] Date of Patent: Nov. 4, 1997

[54] END FACE REFLECTION TYPE SURFACE WAVE RESONATOR

[75] Inventors: Junya Ago, Nagaokakyo; Michio Kadota, Kyoto, both of Japan

[73] Assignee: Murata Manufacturing Co., Ltd., Japan

[21] Appl. No.: 623,631

[22] Filed: Mar. 28, 1996

Related U.S. Application Data

[63] Continuation of Ser. No. 407,239, Mar. 21, 1995, abandoned.

[30] Foreign Application Priority Data

Mar. 25, 1994 [JP] Japan .................. 6-055778

[51] Int. Cl.$^6$ ........................... H03H 9/64
[52] U.S. Cl. ............... 333/195; 310/313 R; 333/193
[58] Field of Search ....................... 333/193–196; 310/313 R, 313 A, 313 B, 313 C, 313 D

[56] References Cited

U.S. PATENT DOCUMENTS

| | | | |
|---|---|---|---|
| 4,012,650 | 3/1977 | Pratt et al. | 333/194 |
| 4,237,433 | 12/1980 | Tanski | 333/195 |
| 4,993,000 | 2/1991 | Niitsuma et al. | 333/194 |
| 5,185,548 | 2/1993 | Egara et al. | |
| 5,196,753 | 3/1993 | Greer | 310/313 B |

FOREIGN PATENT DOCUMENTS

| | | |
|---|---|---|
| 0122217 | 9/1981 | Japan . |
| 0086917 | 5/1984 | Japan . |
| 2244880A | 12/1991 | United Kingdom . |

Primary Examiner—Benny Lee
Assistant Examiner—Darius Gambino
Attorney, Agent, or Firm—Ostrolenk, Faber, Gerb & Soffen, LLP

[57] ABSTRACT

An end face reflection type surface wave resonator utilizing a surface wave of an SH type is constructed by forming comb electrodes on one major surface of a piezoelectric substrate, which constitute an IDT, and forming grooves extending from one major surface to the other major surface to form a pair of end faces on which a surface wave is to be reflected the resonator having piezoelectric plate portions outside the grooves.

22 Claims, 3 Drawing Sheets

5,684,437

END FACE REFLECTION TYPE SURFACE WAVE RESONATOR

This is a Continuation of Application Ser. No. 08/407,239 filed on Mar. 21, 1995, now abandoned.

BACKGROUND OF THE INVENTION

1. Field of the Invention

The present invention relates generally to a surface wave resonator utilizing a surface wave of an SH type such as a BGS wave (Bleustein-Gulyaev-Shimizu wave) or a Love wave, and more particularly, to an end face reflection type surface wave resonator in which a surface wave is reflected by a pair of end faces opposed to each other.

2. Description of the Prior Art

End face reflection type surface wave resonators utilizing a surface wave of an SH type such as a BGS wave or a Love wave are known. FIG. 1 is one example of a perspective view showing a conventional end face reflection type surface wave resonator.

A surface wave resonator 1 is constructed using a piezoelectric substrate 2 in a square plane shape. The piezoelectric substrate 2 is composed of a piezoelectric material such as lead titanate zirconate series piezoelectric ceramics, an $LiNbO_3$ piezoelectric single crystal or an $LiTaO_3$ piezoelectric single crystal. If the piezoelectric substrate 2 is composed of piezoelectric ceramics, the piezoelectric substrate 2 is subjected to polarization processing in a direction indicated by the arrow P as shown.

A pair of comb electrodes 3 and 4 are formed on an upper surface 2a of the piezoelectric substrate 2. The comb electrodes 3 and 4 constitute an interdigital transducer (hereinafter abbreviated as an IDT). The comb electrodes 3 and 4 respectively have electrode fingers 3a to 3c and 4a to 4c.

In the end face reflection type surface wave resonator 1, AC voltages are applied to the comb electrodes 3 and 4, whereby the BGS wave is produced, and the BGS wave propagates in a direction indicated by the arrow X as shown. The BGS wave is reflected by both end faces 2b and 2c of the piezoelectric substrate 2.

In the above described end face reflection type surface wave resonator 1, a frequency spectrum determined by the IDT and a resonant frequency determined by the dimensions between the end faces 2b and 2c are matched with each other, thereby obtaining effective resonance characteristics. In the surface wave resonator 1, the surface wave is reflected between the end faces 2b and 2c, whereby the resonance characteristics are determined, as described above. Therefore, the smoothness of the end faces 2b and 2c and the dimensions between the end faces 2b and 2c must be maintained with high precision. The conventional surface wave resonator 1 is fabricated using the following steps.

Specifically, as shown in the perspective view of FIG. 2, a piezoelectric plate 5 is prepared, and the above described comb electrodes 3 and 4 (which constitute the IDT) are formed on the upper surface of the piezoelectric plate 5. Thereafter, grooves 6 and 7 are formed downward from the upper surface of the piezoelectric plate 5, thereby forming the above described end faces 2b and 2c. Thus, in order to properly form the end faces 2b and 2c, the grooves 6 and 7 are produced by subjecting the piezoelectric plate 5 to high precision processing. Thereafter, the portion of the piezoelectric plate below the bottoms 6a and 7a of the grooves 6 and 7 is cut, thereby obtaining the surface wave resonator 1.

In the surface wave resonator 1, the width of the electrode fingers 3a and 4c which are formed along the edge of the end faces 2b and 2c are set to one-half the width of electrode fingers 3a to 3c and 4a to 4c. Thus, letting λ be the wavelength of the surface wave, the width of the electrode fingers 3a and 4c is λ/8, and the width of the other electrode fingers is λ/4. The electrode fingers 3a and 4c are formed by first forming a plurality of electrode fingers having a width of λ/4 and then forming the grooves 6 and 7 so that the width of the outermost electrode fingers is reduced from λ/4, to λ/8.

When the number of electrode fingers constituting the IDT is decreased, the width W of the surface wave resonator 1 is also decreased, and, the surface wave resonator 1 is liable to be unstable when it is mounted on a case substrate, the base of a hermetically sealed case, a printed circuit board or the like. When one comb electrode 13 constituting an IDT has two electrode fingers 13a and 13b and the other comb electrode 14 has only a single electrode finger 14a, as shown in FIG. 3, for example, the width W of a surface wave resonator 11 is much smaller than the thickness t of a piezoelectric substrate 12. Consequently, the surface wave resonator 11 becomes unstable when it is disposed on the piezoelectric substrate 12 in the orientation as shown. As a result, the surface wave resonator 11 is liable to fall so that an end face 12b or 12c is directed downward, and making electrical connections, such as die bonding, becomes difficult.

SUMMARY OF THE INVENTION

An object of the present invention is to provide an end face reflection type surface wave resonator and a method of fabricating the same in which the stability of chips is enhanced even if the number of electrode fingers is small, thereby making it possible to reliably and easily perform work such as die bonding.

An end face reflection type surface wave resonator according to the present invention is an end face reflection type surface wave resonator utilizing a surface wave of an SH type which comprises a piezoelectric substrate and an IDT formed on one major surface of the piezoelectric substrate, a groove being formed so as to extend from the one major surface to the other major surface of the piezoelectric substrate on at least one side of the IDT and in a direction orthogonal to the surface wave propagating direction thereby producing an end face off of which the surface wave is reflected.

As described above, in the end face reflection type surface wave resonator according to the present invention, the groove is formed on the major surface, of the piezoelectric substrate on which the IDT is formed extends toward the other major surface and is oriented in the direction orthogonal to the surface wave propagating direction, thereby producing at least one end face off of which the surface wave is reflected. Therefore, in the present invention, a portion of the piezoelectric substrate, remains beyond the groove. Accordingly, the width dimension of the surface wave resonator is increased by the portion of the piezoelectric substrate remaining beyond the groove, thereby stabilizing the surface wave resonator.

According to the present invention, at least one end face off of which the surface wave is to be reflected is produced by forming at least one groove in the piezoelectric substrate. Consequently, the width of the piezoelectric substrate portion outside the groove is not a function of the dimension between the end faces which controls resonance characteristics, thereby making it possible to provide an end face reflection type surface wave resonator which is stable. Accordingly, it is possible to enhance the stability of the surface wave resonator during handling, including electrical connecting work, such as die bonding, thereby making it possible to enhance the efficiency of producing components or apparatuses using the end face reflection type surface wave resonator.

Since, an end face reflection type surface wave resonator has end faces on both sides of an IDT. A pair of grooves are preferably formed on both sides of the IDT. However, in the present invention one end face may be formed by the the groove and the other end face maybe formed by cutting the piezoelectric substrate according to the conventional method. Accordingly, in accordance with the present invention, at least one end face is formed by at least one groove.

It has been determined that work such as die bonding becomes difficult if the width W of the above described surface wave resonator is smaller than two-thirds the thickness t of the piezoelectric substrate. Accordingly, the dimension of the piezoelectric substrate portion beyond the groove is preferably determined so that the width W of the surface wave resonator is larger than two-thirds the thickness t of the piezoelectric substrate.

A method of fabricating an end face reflection type surface wave resonator according to the present invention comprises the steps of forming an IDT on a piezoelectric plate, forming a groove on at least one side of the IDT extending from one major surface toward the other major surface of the piezoelectric plate, and in a direction orthogonal to the surface wave propagating direction thereby obtaining an end face off of which a surface wave is reflected and dividing the piezoelectric plate beyond the groove, thereby obtaining the end face reflection type surface wave resonator.

In the method of fabricating the surface-wave resonator according to the present invention, the IDT is formed on the piezoelectric plate and the groove is formed on at least one side of the IDT, as described above, thereby obtaining the end face off of which the surface wave is reflected. The piezoelectric plate is divided beyond the groove after the groove is formed. Consequently, it is possible to fabricate the end face reflection type surface wave resonator according to the present invention having a portion of the piezoelectric substrate beyond the groove. In the fabricating method according to the present invention, the division is preferably made so that the width W of a piezoelectric substrate thereby obtained is larger than two-thirds the thickness t of the piezoelectric substrate as described above.

In the method of fabricating the end face reflection type surface wave resonator according to the present invention, at least one groove is formed to obtain the end face off of which the surface wave is reflected (as-described-above) and, thereafter, the piezoelectric plate is only divided beyond the groove, thereby making it possible to provide the end face reflection type surface wave resonator. Accordingly, it is possible to provide an end face reflection type surface wave resonator having superior stability without increasing the number of manufacturing steps.

More preferably, the division of the piezoelectric plate beyond the groove is made by forming a second groove extending from at least one major surface to the other major surface of the piezoelectric plate. Specifically, a second groove is formed beyond the first groove (to-construct the end face on at least one side of the IDT) and the portion of piezoelectric substrate between the bottom of the second groove and the other major surface is severed by exerting an external force or dividing the portion of piezoelectric substrate by machining. When the method of forming the second groove to divide the piezoelectric plate is employed, it is possible to prepare a mother piezoelectric plate on which a plurality of IDTs are formed on one major surface thereof specifically, a second groove for separating the surface wave resonator is formed after forming the end face. Thus, it is possible to obtain a structure or which a lot of surface wave resonators are connected to each other through the second groove newly formed. Consequently, it is possible to measure the characteristics of each of the surface wave resonators while the surface wave resonators are connected to each other on the mother piezoelectric plate.

In the surface wave resonator according to the present invention, at least one end face off of which the surface wave is to be reflected is constructed by forming the above described groove. Further, a portion of the piezoelectric substrate is provided beyond the groove.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be described with reference to the drawings, thereby clarifying the present invention.

Figure 1:
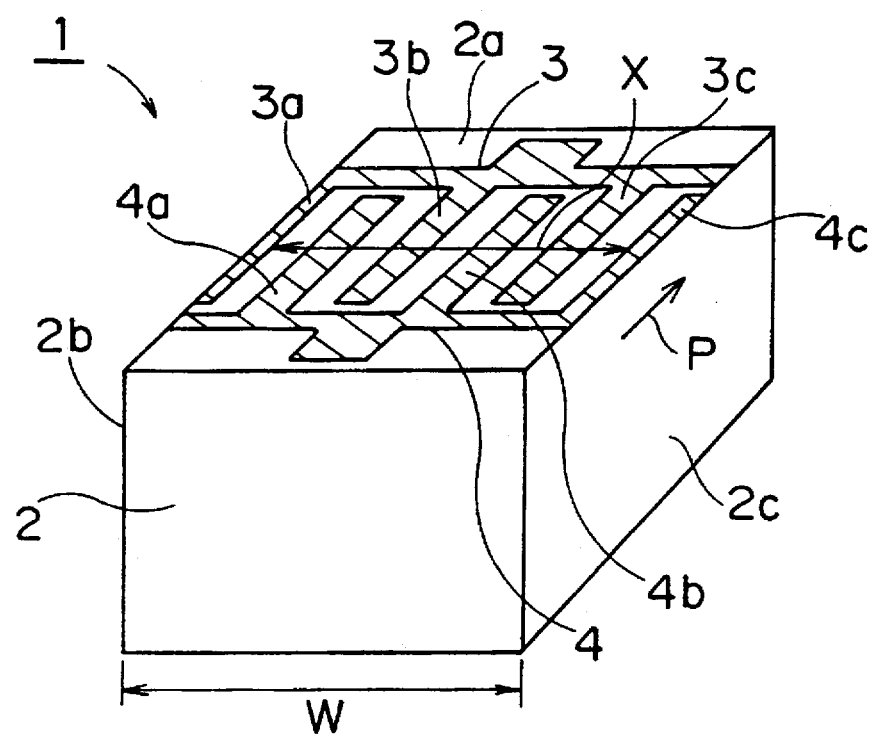
FIG. 1 is a perspective view showing a conventional end face reflection type surface wave resonator.
Figure 2:
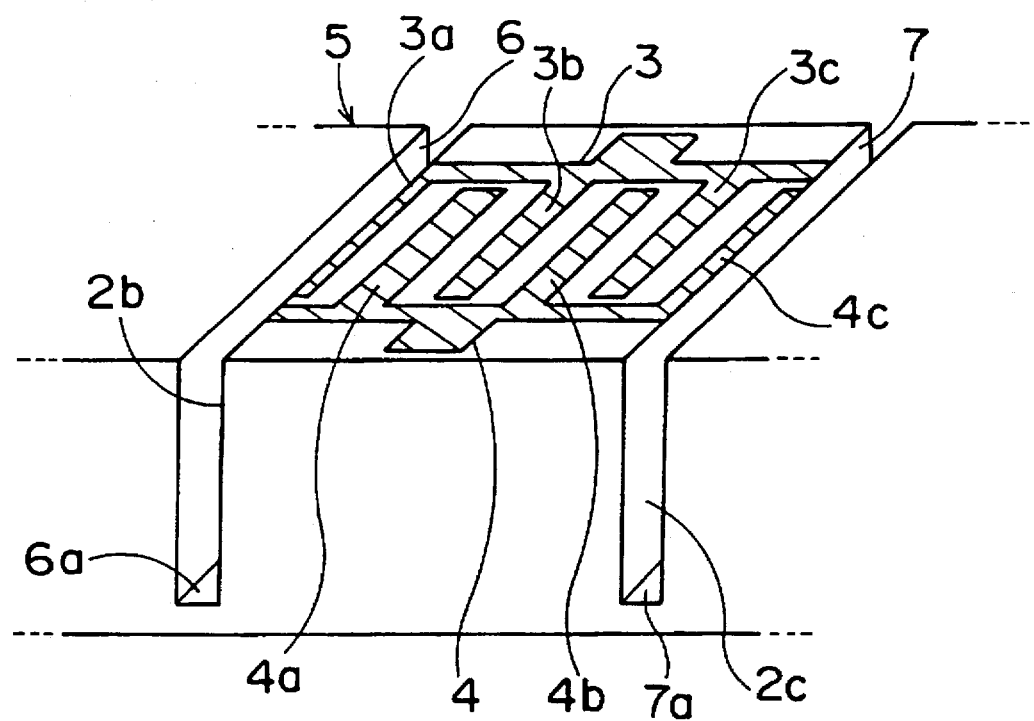
FIG. 2 is a perspective view for explaining the steps of fabricating the conventional end face reflection type surface wave resonator.
Figure 3:
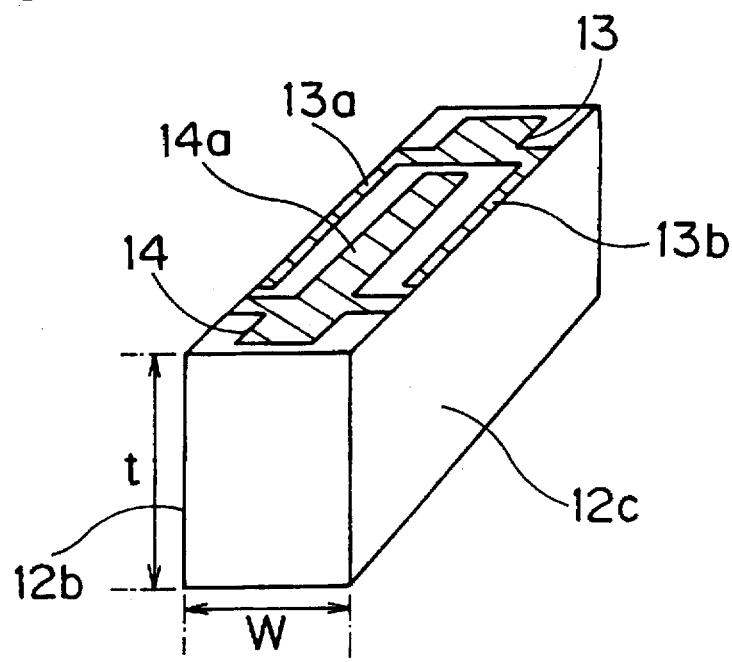
FIG. 3 is a perspective view for explaining the problems of the conventional end face reflection type surface wave resonator.
Figure 4:
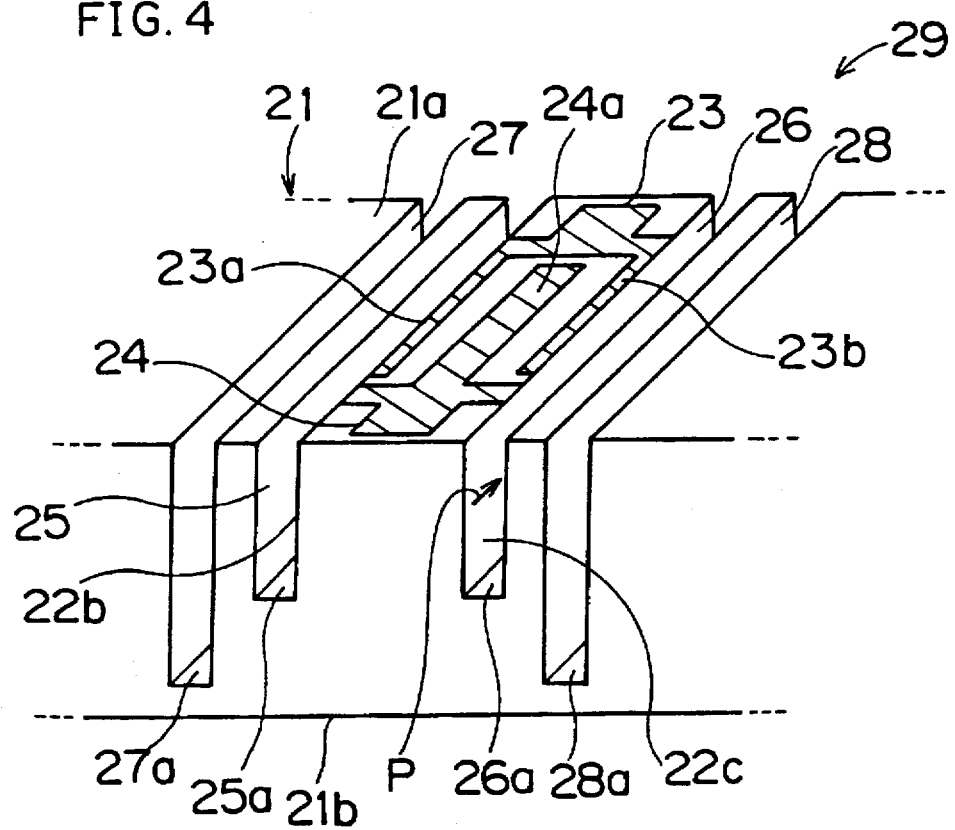
FIG. 4 is a perspective view for explaining the steps of fabricating an end face reflection type surface wave resonator according to an embodiment of the present invention.

FIG. 4 is a perspective view for explaining a method of fabricating a surface wave resonator according to one embodiment of the present invention.

First piezoelectric plate 21 is prepared. The piezoelectric plate 21 is composed of piezoelectric ceramics such as lead titanate zirconate series piezoelectric ceramics or a piezoelectric single crystal such as an $LiNbO_3$ piezoelectric single crystal or an $LiTaO_3$ piezoelectric single crystal. If the piezoelectric plate 21 is composed of piezoelectric ceramics, the piezoelectric plate 21 is subjected to polarization processing in the direction indicated by an arrow P as shown. That is, the piezoelectric plate 21 is subjected to polarization processing in a direction parallel to a major surface 21a of the piezoelectric plate 21.

A pair of comb electrodes 23 and 24 are formed on the major surface 21a of the piezoelectric plate 21. The comb electrodes 23 and 24 are composed of a conductive material such as aluminum or copper. In addition, the comb electrodes 23 and 24 can be formed using a suitable method such as forming a thin film composed of a conductive material on the upper surface of the piezoelectric plate 21 using a process such as evaporation, plating or sputtering and then patterning the thin film.

The comb electrode 23 has electrode fingers 23a and 23b, while the comb electrode 24 has a single electrode finger 24a. Letting $\lambda$ be the wavelength of a surface wave, the width of the electrode finger 24a is $\lambda/4$, while the pitch between the adjacent electrode fingers is also $\lambda/4$. The width of the electrode fingers 23a and 23b is $8/\lambda$.

The width $\lambda/8$ of the electrode fingers 23a and 23b is adjusted while forming grooves 25 and 26. Specifically, electrode fingers having the same width ($\lambda/4$) as that of the electrode finger 24a are first formed in the areas where the electrode fingers 23a and 23b are to be positioned. Grooves 25 and 26 extending from the major surface 21a toward the other major surface 21b of the piezoelectric plate 2 are then formed. The grooves 25 and 26 are formed in order to obtain end faces 22b and 22c on which a BGS wave (produced by applying AC voltages from the comb electrodes 23 and 24) is reflected. The grooves 25 and 26 are formed using a dicer or the like so that when the end faces 22b and 22c are made the width of the electrode fingers 23a and 23b are reduced to $\lambda 8/$ as described above.

Since the grooves 25 and 26 are provided in order to form the end faces 22b and 22c as described above, the direction in which the grooves 25 and 26 extend is the direction orthogonal to the surface wave propagating direction and parallel to the electrode fingers 23a, 23b and 24a.

Furthermore, as apparent from FIG. 4, the bottoms 25a and 26a of the grooves 25 and 26 respectively are of a depth so as not to read the other major surface 21b. The grooves 25 and 26 must have a predetermined depth so that the excited BGS wave can be reliably reflected by the end faces 22b and 22c. Since the surface wave of an SH type propagates near the surface of a piezoelectric substrate, the grooves 25 and 26 need not have a depth which reaches to the other major surface 21b. In the present embodiment, therefore, the depth of the grooves 25 and 26 is approximately one-half the thickness t of the piezoelectric plate 21, as shown. In order to form the end faces 22b and 22c off of which the surface wave (for example, an SH type such as the BGTS wave) is to be reliably reflected, it is desirable that the depth of the grooves 25 and 26, that is, the height of the end faces 22b and 22c, is in the range of 1 $\lambda$ to 7 $\lambda$.

Second grooves 27 and 28 are then formed outside the grooves 25 and 26. The second grooves 27 and 28 are provided so as to separate a surface wave resonator obtained in the present embodiment from the other portions of the piezoelectric plate 21. Although the grooves 27 and 28 extend parallel to the grooves 25 and 26, the grooves 27 and 28 need not be parallel to the grooves 25 and 26. Since it is preferable in terms of standardization of the shape of products that the plane shape of the surface wave resonator is rectangular, the grooves 27 and 28 are preferably formed parallel to the grooves 25 and 25 as in the present embodiment.

Furthermore, the bottoms 27a and 28a of the grooves 27 and 28 do not reach to the other major surface 21b. Specifically, a surface wave resonating portion 29 according to the present embodiment which is constructed by forming the grooves 27 and 28 is connected to the other portions of the piezoelectric plate 21. If a plurality of surface wave resonating portions are formed in a mother piezoelectric plate 21 each having structures as shown in FIG. 4, the characteristics of the resonators can be measured, on the mother piezoelectric plate 21 without separating each of the surface wave resonating portions.

Figure 5:
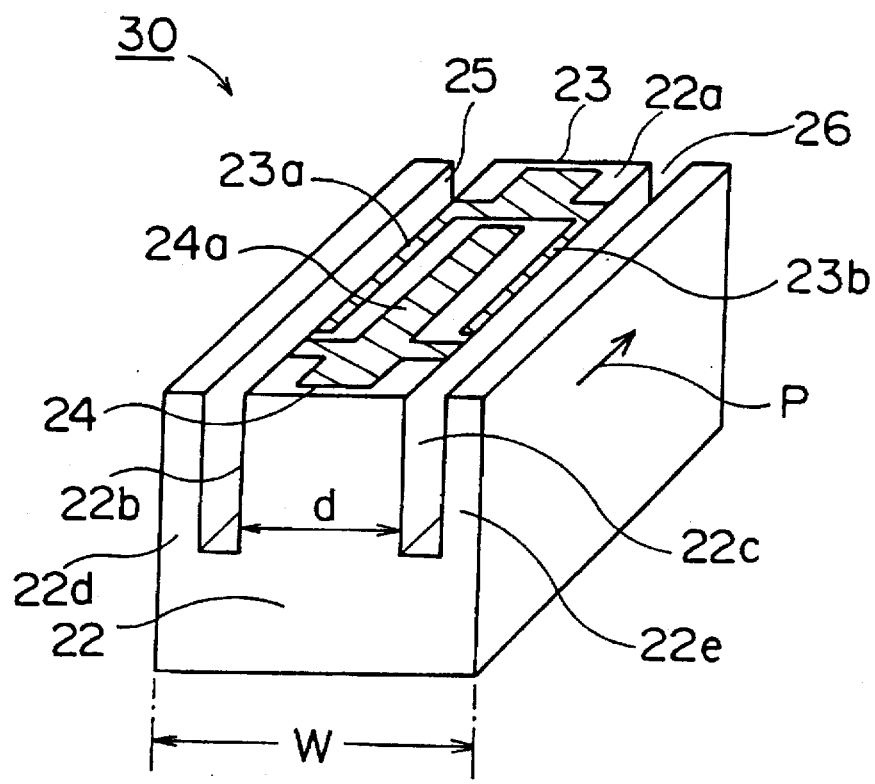
FIG. 5 is a perspective view showing the end face reflection type surface wave resonator according to one embodiment of the present invention.

The above described surface wave resonating portion 29 is then separated by cutting the material below the bottoms 27a and 28a of the grooves 27 and 28, thereby making it possible to obtain the surface wave resonator 30 as shown in FIG. 5.

In the end face reflection type surface wave resonator 30, a piezoelectric substrate 22 is constructed using the above described cutting method. An IDT which comprises the above described comb electrodes 23 and 24 is formed on one major surface of the piezoelectric substrate 22. In addition, end faces 22b and 22c are constructed by forming the above described grooves 25 and 26, whereby the surface wave is reflected between the end faces 22b and 22c. Specifically, the resonance characteristics are determined by the dimension of the IDT and the dimensions d between the end faces 22b and 22c. The width of the surface wave resonator 30 is the distance W between outer side surfaces of piezoelectric substrate portions 22d and 22e which exist beyond the grooves 25 and 26. Accordingly, the overall width W of the resonator 30 can be made larger than the thickness d of the piezoelectric substrate 22 even when the number of electrode fingers in the IDT is very small. Therefore, the dimension d between the end faces 22b and 22c may be small, as in the surface wave resonator 30 according to the present embodiment.

In order to perform work such as die bonding on a stable resonator, the width W of the surface wave resonator 30 must be larger than two-thirds of the thickness t of the piezoelectric substrate 22. Consequently, the width W is preferably determined to be larger than two-thirds of the thickness t of the piezoelectric substrate 22. In the fabricating method according to the present embodiment, the width W may be determined by matching the distance between the above described grooves 27 and 28 with the width W in forming the grooves 27 and 28, thereby making it possible to easily control the width W.

Although in the above described embodiment, the second grooves 27 and 28 are formed after forming the grooves 25 and 26 and thereafter the piezoelectric substrate portion below the bottoms 27a and 28a of the grooves 27 and 28 is further cut to obtain the piezoelectric resonator 30, the surface wave resonator 30 can also be obtained by cutting the piezoelectric plate 21 so that piezoelectric substrate portions having a certain width remain outside the grooves 25 and 26 without forming the grooves 27 and 28.

Furthermore, although in the above described embodiment, a description was made of a structure in which only one IDT was formed, the end face reflection type surface wave resonator according to the present invention may have two or more sets of IDTs.

Figure 6:
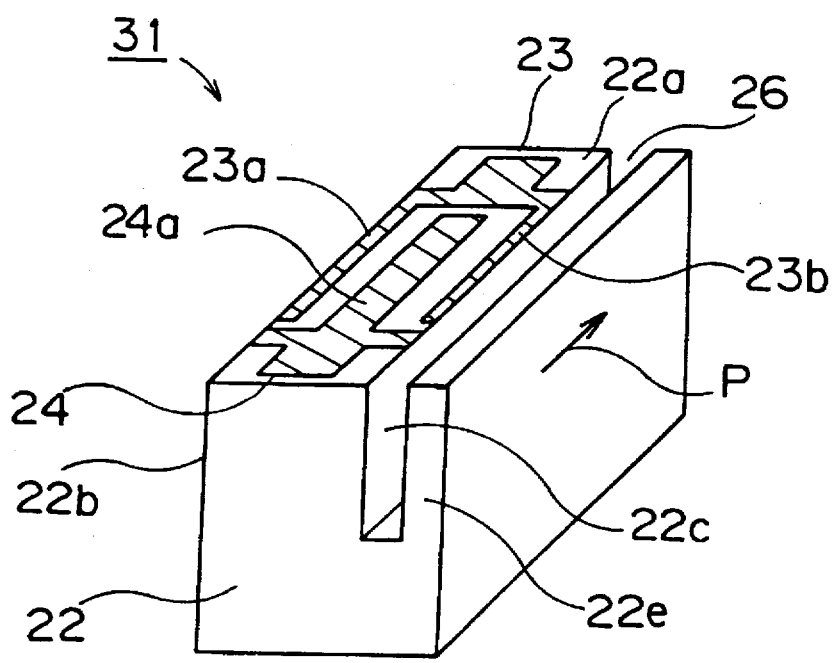
FIG. 6 is a perspective view for explaining a modified example of the end face reflection type surface wave resonator according to and embodiment of the present invention.

Additionally, although in the above described embodiment, a description was made of a structure in which the grooves 25 and 26 were formed on both sides of the IDT respectively in order to form the end faces on which the BGS wave was be reflected, the groove in the present invention may be formed on only one side of the IDT. Specifically, a surface wave resonator 31 in which a groove 26 is formed on only one side of an IDT may be used is shown in FIG. 6. In this case, the same effect as that in the above described embodiment is obtained. Specifically, the width of a piezoelectric substrate portion 22e outside the groove 26 is controlled, thereby making it possible to obtain an end face reflection type surface wave resonator which is stable.

The surface wave resonator 31 shown in FIG. 6 is the same as the surface wave resonator 30 shown in FIG. 5 except that the groove 26 and the piezoelectric substrate portion 22e are provided on only one side of the IDT. Consequently, the same portions are assigned the same reference numerals and, therefore, a description thereof is not repeated.

Although the present invention has been described and illustrated in detail, it is clearly understood that the same is by way of illustration and example only and is not to be taken as a limitation, the spirit and scope of the present invention being limited only by the terms of the appended claims.

What is claimed is:

1. An end face reflection type surface wave resonator for producing an SH-type surface wave, comprising:

a piezoelectric substrate having first and second major surfaces in opposed position to one another, third and fourth surfaces in an opposed position to one another, a first end face for reflecting a surface wave, and a second end face for reflecting the surface wave, said first and second end faces being in an opposed position to one another and extending to said third and fourth surfaces at their respective edges;

an interdigital transducer formed on said first major surface of said piezoelectric substrate having a plurality of electrode fingers, said plurality of electrode fingers extending in a direction which bisects said third and fourth surfaces, the edges of outermost electrode fingers being in contact with the edges of said first and second end faces respectively, said outermost electrode fingers having a width of about λ/8, the remaining electrode fingers having a width of about λ/4; and a first channel having a depth extending from said first major surface toward said second major surface and a length extending from said third surface to said fourth surface of said piezoelectric substrate in a direction orthogonal to the surface wave propagating direction, said first channel forming at least one of said first and second end surfaces on at least one side of said interdigital transducer.

2. The end face reflection type surface wave resonator according to claim 1, further comprising:

a second channel having a depth extending from said first major surface toward said second major surface and a length extending from said third surface to said fourth surface of said piezoelectric substrate in a direction orthogonal to the surface wave propagating direction, said second channel forming the other of said first and second end surfaces, said first and second end surfaces being disposed on each side of said interdigital transducer respectively.

3. The end face reflection type surface wave resonator according to claim 1, wherein said first channel forms one of said first and second end surfaces disposed on only one side of said interdigital transducer.

4. The end face reflection type surface wave resonator according to claim 1, wherein the width W of said end face reflection type surface wave resonator is larger than two-thirds of the thickness t of said piezoelectric substrate.

5. The end face reflection surface wave resonator according to claim 1, wherein the depth of said first channel is in the range of λ to 7λ, λ being the wavelength of the surface wave.

6. A method of fabricating an end face reflection type surface wave resonator, comprising the steps of:

forming a piezoelectric substrate comprising first and second major surfaces in opposed position to one another, third and fourth surfaces in an opposed position to one another, a first end face for reflecting a surface wave, and a second end face for reflecting the surface wave, said first and second end faces being in an opposed position to one another and extending to said third and fourth surfaces at their respective edges;

forming an interdigital transducer on said first major surface of said piezoelectric substrate having a plurality of electrode fingers, said plurality of electrode fingers extending in a direction which bisects said third and fourth surfaces, the edges of outermost electrode fingers being in contact with the edges of said first and second end faces respectively, said outermost electrode fingers having a width of about λ/8, the remaining electrode fingers having a width of about λ/4;

forming a first channel having a depth extending from said first major surface toward said second major surface and a length extending from said third surface to said fourth surface of said piezoelectric substrate in a direction orthogonal to the surface wave propagating direction, said first channel forming at least one of said first and second end surfaces on at least one side of said interdigital transducer; and forming a barrier further from said interdigital transducer than said first channel, said barrier dividing an unused portion of said piezoelectric substrate from said end face reflection type surface wave resonator.

7. The method according to claim 6, further comprising the step of forming a second channel having a depth extending from said first major surface toward said second major surface and a length extending from said third surface to said fourth surface of said piezoelectric substrate in the direction orthogonal to the surface wave propagating direction, said second channel forming the other of said first and second end surfaces, said first and second end surfaces being disposed on each side of said interdigital transducer respectively.

8. The method according to claim 6, wherein said first channel forms one of said first and second end surfaces disposed on only one side of said interdigital transducer.

9. The method according to claim 6, further comprising the step of forming the width W of said end face reflection type surface wave resonator to be larger than two-thirds of the thickness t of said piezoelectric substrate.

10. The method according to claim 6, further comprising the step of forming the depth of said first channel to be in the range of λ to 7 λ, λ being the wavelength of the surface wave.

11. The method according to claim 6, wherein said step of forming a barrier further from said interdigital transducer than said first channel further comprises the step of forming a second channel having a depth extending from said first major surface to said second major surface and a length extending from said third surface to said fourth surface of said piezoelectric substrate beyond said first groove and dividing a piezoelectric plate portion below said second groove.

12. The method according to claim 11, wherein said second channel is formed parallel to said first channel.

13. The end face reflection surface wave resonator according to claim 2, wherein the depth of said second channel is in the range of λ to 7λ, λ being the wavelength of the surface wave.

14. An end face reflection type surface wave resonator producing an SH-type surface wave, comprising:

a piezoelectric substrate of substantially rectangular shape comprising first and second surfaces in opposed position to one another, third and fourth surfaces in an opposed position to one another, a first end face for reflecting a surface wave, and a second end face for reflecting the surface wave, said first and second end faces being in an opposed position to one another and extending to said third and fourth surfaces at their respective edges;

an interdigital transducer formed on said first surface of said piezoelectric substrate comprising a first and second set of electrode fingers, said electrode fingers positioned in interdigitized relationship with one another and extending in a direction substantially parallel to said first and second end surfaces; and a first channel having a depth extending from said first surface toward said second surface and a depth extending from said third surface to said fourth surface of said piezoelectric substrate in a direction orthogonal to the surface wave propagating direction, said first channel forming at least one of said first and second end surfaces of said surface wave resonator.

15. The end face reflection surface wave resonator according to claim 14, wherein the edges of the outermost electrode fingers of one of said first and second set of electrode fingers being in contact with the edges of said first and second end faces respectively.

16. The end face reflection surface wave resonator according to claim 15, wherein said outermost electrode fingers having a width of about $\lambda/8$, the remaining electrode fingers having a width of about $\lambda/4$.

17. The end face reflection surface wave resonator according to claim 14, wherein one of said first and second sets of electrode fingers consists of two electrode fingers and the other set of electrode fingers consists of one electrode finger.

18. The end face reflection type surface wave resonator according to claim 14, wherein the width W of said end face reflection type surface wave resonator is larger than two-thirds of the thickness t of said piezoelectric substrate.

19. The end face reflection surface wave resonator according to claim 14, wherein the depth of said first channel is in the range of $\lambda$ to $7\lambda$, $\lambda$ being the wavelength of the surface wave.

20. The end face reflection type surface wave resonator according to claim 14, further comprising:

a second channel extending from said third surface to said fourth surface of said piezoelectric substrate in a direction orthogonal to the surface wave propagating direction, said second channel forming the other of said first and second end surfaces of said surface wave resonator.

21. The end face reflection surface wave resonator according to claim 18, wherein the depth of said second channel is in the range of $\lambda$ to $7\lambda$, $\lambda$ being the wavelength of the surface wave.

22. The method according to claim 11, wherein said step of forming a barrier further from said interdigital transducer than said first channel further comprises the step of cutting the material below the bottom portion of said second channel to sever said end face reflection type surface wave resonator from said piezoelectric substrate.

* * * * *